United States Patent
Wang et al.

(10) Patent No.: US 12,446,324 B2
(45) Date of Patent: Oct. 14, 2025

(54) DEVICE AND SYSTEM FOR ESD PROTECTION

(71) Applicant: Microchip Technology Incorporated, Chandler, AZ (US)

(72) Inventors: Dong Wang, Chandler, AZ (US); Jim Nolan, Chandler, AZ (US); HongZhong Xu, Chandler, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 188 days.

(21) Appl. No.: 18/520,616

(22) Filed: Nov. 28, 2023

(65) Prior Publication Data
US 2024/0355809 A1  Oct. 24, 2024

Related U.S. Application Data (60) Provisional application No. 63/460,687, filed on Apr. 20, 2023.

(51) Int. Cl.
H10D 89/60  (2025.01)

(52) U.S. Cl.
CPC ......... H10D 89/811 (2025.01); H10D 89/921 (2025.01)

(58) Field of Classification Search
CPC ........................... H10D 89/811; H10D 89/921
USPC .......................................................... 361/56
See application file for complete search history.

(56) References Cited

U.S. PATENT DOCUMENTS

| | | | | |
|---|---|---|---|---|
| 6,373,104 B1* | 4/2002 | Smith | .................. | H10D 89/815 257/361 |
| 9,006,783 B2* | 4/2015 | Di Sarro | .............. | H10D 89/713 257/173 |
| 10,903,205 B2* | 1/2021 | Lin | ...................... | H10D 89/713 |
| 2005/0133870 A1 | 6/2005 | Manna et al. | ................. | 257/355 |
| 2006/0223258 A1* | 10/2006 | Okushima | ............ | H10D 89/711 438/202 |
| 2010/0123984 A1* | 5/2010 | Lin | ...................... | H10D 89/911 361/56 |
| 2012/0286325 A1* | 11/2012 | Coyne | .................... | H10D 10/40 257/140 |
| 2018/0090482 A1* | 3/2018 | Lee | ...................... | H10D 89/815 |
| 2020/0176441 A1 | 6/2020 | Gorbachov et al. | | |

FOREIGN PATENT DOCUMENTS

CN        103515374 A      1/2014   ............. H01L 27/02

OTHER PUBLICATIONS

International Search Report and Written Opinion, Application No. PCT/US2024/025633, 12 pages.

* cited by examiner

Primary Examiner — Sreeya Sreevatsa
(74) Attorney, Agent, or Firm — SLAYDEN GRUBERT BEARD PLLC (57) ABSTRACT

A circuit for electrostatic discharge (ESD) protection may protect sensitive circuits in the presence of both positive and negative ESD events. A protection transistor may be coupled to a pad, and a protection clamp may be coupled to the protection transistor. The protection transistor may be in an isolation n-well, and a current limiting resistor may be coupled from the pad to the isolation n-well. In operation, the current limiting resistor may limit the current during negative ESD events.

15 Claims, 6 Drawing Sheets

DEVICE AND SYSTEM FOR ESD PROTECTION

PRIORITY

This application claims priority to commonly owned U.S. Patent Application No. 63/460,687 filed on Apr. 20, 2023, the entire contents of which are hereby incorporated by reference for all purposes.

FIELD OF THE INVENTION

The present disclosure relates to devices and methods for protecting electronic circuits from damage due to electrostatic discharge (ESD).

BACKGROUND

Electronic circuits may be exposed to very high voltages during handling, assembly and during operation. As one of various examples, a technician handling a semiconductor device may discharge static electricity from their body to the semiconductor device. These discharge events may expose semiconductor devices to voltages in excess of 1000V. These discharge events are termed electrostatic discharge (ESD) events. Voltages applied during ESD events may be positive voltages above ground, or negative voltages below ground.

ESD events may cause permanent damage to a semiconductor device, and, for this reason, significant design and validation work is expended to design special protection circuits to protect internal circuitry within the semiconductor device from excessive voltages and currents during ESD events.

ESD protection circuitry in the semiconductor device may consist of a clamp from a pin to ground from a pin to a supply voltage. In one of various examples, the clamp may be a diode. When an excessive positive voltage is applied to the pin, the diode may reverse bias and when its reverse breakdown voltage is reached, the diode may provide a low-impedance discharge path for current to flow to ground. This low-impedance discharge path can prevent excessive voltages from reaching sensitive circuits inside the semiconductor device.

In the case of an excessive negative voltage applied to the pin, the diode may forward bias and allow current to flow from a ground connection within the semiconductor device, through the diode, and out of the semiconductor device. This forward-biased operation may introduce large current flows and large negative voltages which may damage internal circuitry.

There is a need for ESD protection circuits which protect internal circuitry against both large positive and negative input voltages and limit current flows from such ESD events.

SUMMARY

The examples herein enable a circuit which may protect electronic circuits from damage due to positive and negative ESD events.

According to one aspect, a device includes a current limiting resistor with a first node coupled to a pad and a second node coupled to an isolation n-well. The device includes a protection transistor located inside the isolation n-well, and a protection clamp located outside the isolation n-well. The protection clamp has a cathode coupled to a drain node of the protection transistor and an anode coupled to a fixed voltage. The protection transistor may be located within the isolation n-well and may include a source node coupled to the pad, a gate node coupled to the pad, and a bulk node coupled to the pad.

According to one aspect, a system includes a pad, a current limiting resistor with a first node coupled to the pad and a second node coupled to an isolation n-well. The system includes a protection transistor located inside the isolation n-well and a protection clamp located outside the isolation n-well. The protection clamp includes a cathode coupled to a drain node of the protection transistor and an anode coupled to a fixed voltage The protection transistor may be located within the isolation n-well and may include a source node coupled to the pad, a gate node coupled to the pad, and a bulk node coupled to the pad. Furthermore, one or more circuits may be coupled to the pad.

According to one aspect, the examples herein enable a method including detecting a voltage at a pad, activating, based on the detected voltage exceeding a predetermined range of allowable voltages, a discharge path, the discharge path based at least on the polarity of the voltage at the pad, and limiting the current in the discharge path to a level below a predetermined current threshold.

BRIEF DESCRIPTION OF THE DRAWINGS

The figures illustrate examples of devices, systems and methods for protecting electronic circuits from damage due to ESD events.

DETAILED DESCRIPTION

Figure 1:
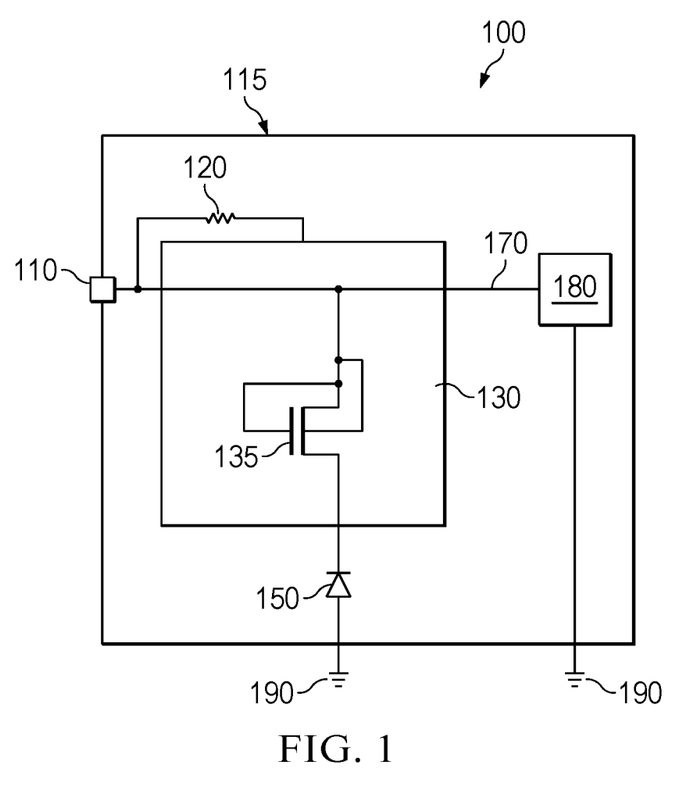
FIG. 1 illustrates one of various examples of an ESD protection circuit.

FIG. 1 illustrates one of various examples of an ESD protection circuit 100. Pad 110 may be a pad on a semiconductor device 115. ESD protection circuit 100 may protect internal circuit 180 within semiconductor device 115 from negative ESD events and positive ESD events. A negative ESD event may be an ESD event in which the voltage at pad 110 is below ground. A positive ESD event may be an ESD event in which the voltage at pad 110 is above ground. The term ground, as used herein, is not meant to be limited to earth ground, and may include any common potential. Semiconductor device 115 may be a semiconductor device in a package, the package including but not limited to a DIP (Dual-Inline Package), SOP (Small Outline Package), QFP (Quad Flat Package), TSOP (Thin Small Outline Package), PLCC (Plastic Leaded Chip Carrier), BGA (Ball Grid Array), WLP (Wafer Level Package) or another package type.

Pad 110 may be coupled to protection transistor 135. Protection transistor 135 may be a negative protection circuit to protect internal circuit 180 from negative ESD events at pad 110. Pad 110 may be coupled to the gate node of protection transistor 135. Pad 110 may be coupled to the source node of protection transistor 135. Pad 110 may be coupled to the bulk node of protection transistor 135. Protection transistor 135 may be placed in an isolation n-well 130. Isolation n-well 130 may be an n-type doped semiconductor material. Pad 110 may be coupled to internal circuit 180 via path 170. Internal circuit 180 may be one or more transistors, one or more passive components, or another electrical circuit. Protection clamp 150 may be a positive protection circuit to protect internal circuit 180 from positive ESD events. The cathode of protection clamp 150 may be coupled to the drain of protection transistor 135. Protection clamp 150 may be a PNP diode or an NPN diode or may be another device to clamp current flow. The anode of protection clamp 150 may be coupled to ground.

Current limiting resistor 120 may be coupled between isolation n-well 130 and pad 110. Current limiting resistor 120 may limit current flowing to pad 110 during negative ESD events.

Protection transistor 135 and protection clamp 150 may be designed with specific breakdown voltages such that when a voltage at pad 110 exceeds a predetermined threshold, a discharge path may be activated and may limit the voltage on pad 110.

Figure 2:
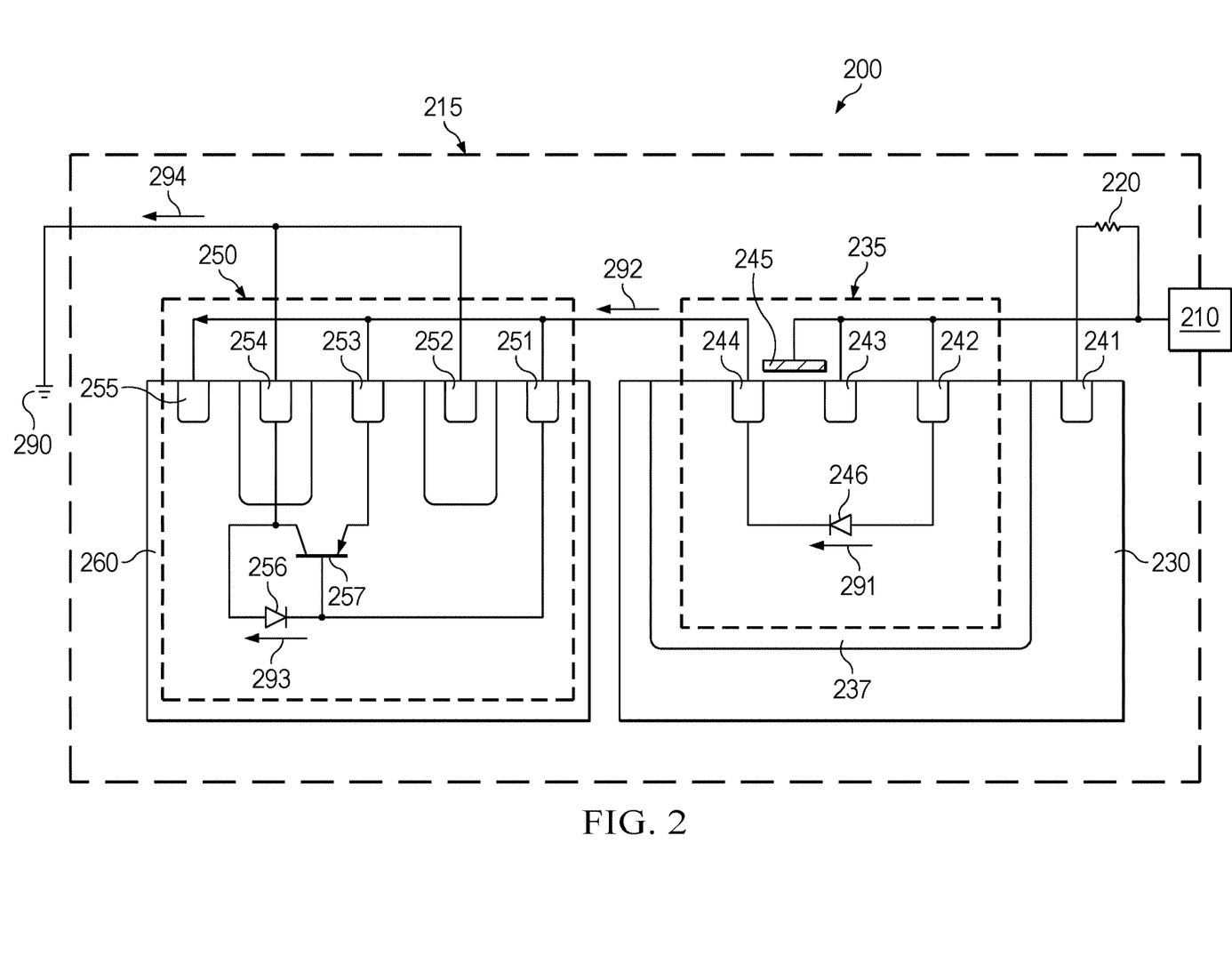
FIG. 2 illustrates one of various examples of a cross-section of an ESD protection circuit during a positive ESD event.

FIG. 2 illustrates one of various examples of a cross-section of an ESD protection circuit 200 during a positive ESD event.

Pad 210 may be a pad on semiconductor device 215. Pad 210 may be coupled to a first node of current limiting resistor 220. A second node of current limiting resistor 220 may be coupled to isolation n-well 230 at well tie 241. Isolation n-well 230 may be an n-type doped semiconductor material. Well tie 241 may be an n-type doped semiconductor material. Well tie 241 may be a higher doping density than isolation n-well 230. Well tie 241 may provide an Ohmic contact between the second end of current limiting resistor 220 and isolation n-well 230.

Pad 210 may be coupled to source node 243 of protection transistor 235. Source node 243 may be an n-type doped semiconductor material. Pad 210 may be coupled to bulk node 242 of protection transistor 235. Bulk node 242 may be a p-type doped semiconductor material. Bulk node 242 may provide an Ohmic contact between pad 210 and p-well 237. P-well 237 is formed within isolation n-well 230.

Diode 246 may be formed between the p-type doped semiconductor material of bulk node 242 and the n-type doped semiconductor material of drain node 244.

Protection transistor 235 may be one of various examples of protection transistor 135 as described and illustrated in reference to FIG. 1. Pad 210 may be coupled to gate node 245 of protection transistor 235. Protection transistor 235 is formed within p-well 237.

Drain node 244 of protection transistor 235 may be coupled to protection clamp 250. Protection clamp 250 is illustrated as a diode-connected PNP transistor, but this is not intended to be limiting. Protection clamp 250 may be another clamp or diode structure not illustrated in FIG. 2.

Drain node 244 of protection transistor 235 may be coupled to a first base node 251 and a second base node 255 of protection clamp 250. First base node 251 may be an n-type doped semiconductor material. First base node 251 may provide an Ohmic contact between the drain node 244 of protection transistor 235 and n-well 260. Second base node 255 may be an n-type doped semiconductor material. Second base node 255 may provide an Ohmic contact between the drain node 244 of protection transistor 235 and n-well 260.

The example of FIG. 2 is illustrated with two base nodes, first base node 251 and second base node 255, but this is not intended to be limiting. Protection clamp 250 may include a single base node connection or may include more than two base node connections.

Drain node 244 of protection transistor 235 may be coupled to emitter node 253 of protection clamp 250. Emitter node 253 may be a p-type doped semiconductor material. Emitter node 253 and n-well 260 may form a PN junction.

First collector node 252 of protection clamp 250 may be coupled to ground 290. Second collector node 254 of protection clamp 250 may be coupled to ground 290. First collector node 252 may be a p-type doped semiconductor material. First collector node 252 and n-well 260 may form a PN junction. Second collector node 254 may be a p-type doped semiconductor material. Second collector node 254 and n-well 260 may form a PN junction diode 256, with the cathode of PN junction diode 256 formed of a portion of n-well 260.

Parasitic bipolar device 257 may be formed by second collector node 254, base node 251, and emitter node 253. Parasitic bipolar device 257 may enter a snapback mode when sufficient current flows between second collector node 254 and base node 251. Snapback mode may provide an additional discharge path and may limit the voltage on pad 210.

An additional bipolar device may be formed by first collector node 252, base node 251 and emitter node 253, but this is not shown to improve the readability of FIG. 2.

Other parasitic junctions and transistors may exist in ESD protection circuit 200, but these are not illustrated to improve the readability of the figure. This is not intended to be limiting.

In operation, during a positive ESD event, the voltage on pad 210 may increase to a high voltage above ground 290. The voltage may rise on bulk node 242, and diode 246 may forward bias. Under the forward bias condition of diode 246, current may flow from bulk node 242 to drain node 244, illustrated by arrow 291. Current may flow out drain node 244, illustrated by arrow 292.

Current may flow to first base node 251, increasing the voltage at first base node 251. The increasing voltage at first base node 251 may reverse bias PN junction diode 256. As the reverse bias increases, PN junction diode 256 may reach a breakdown voltage, and current may flow from the cathode of PN junction diode 256 to the anode of PN junction diode 256, illustrated by path 293. The current flow from first base node 251 to the base connection at parasitic bipolar device 257 may result in a voltage difference between first base node 251 and the base connection at parasitic bipolar device 257 due to the resistance of n-well 260. The voltage at the base connection of bipolar device may drop below the voltage at emitter node 253, and the base-emitter junction may forward bias and parasitic bipolar device 257 may enter a snapback mode, and may conduct current from emitter node 253 to second collector node 254 and to ground 290, illustrated by path 294. An additional bipolar device may be formed between first collector node 252, base node 251 and emitter node 253, and may operate in a manner similar to parasitic bipolar device 257. In this manner, a discharge path may be activated between pad 210 and ground return 290, and the voltage on pad 210 may be limited to the reverse bias breakdown voltage of PN junction diode 256 plus the forward bias voltage of PN junction diode 246.

Protection transistor 235 may be designed with specific breakdown voltages such that when a voltage at pad 210 exceeds a predetermined threshold, a discharge path may be activated and may limit the voltage on pad 210. Current limiting resistor 220 may be designed with a specific resistance value to limit current flow through pad 210 below a predetermined threshold.

Figure 3:
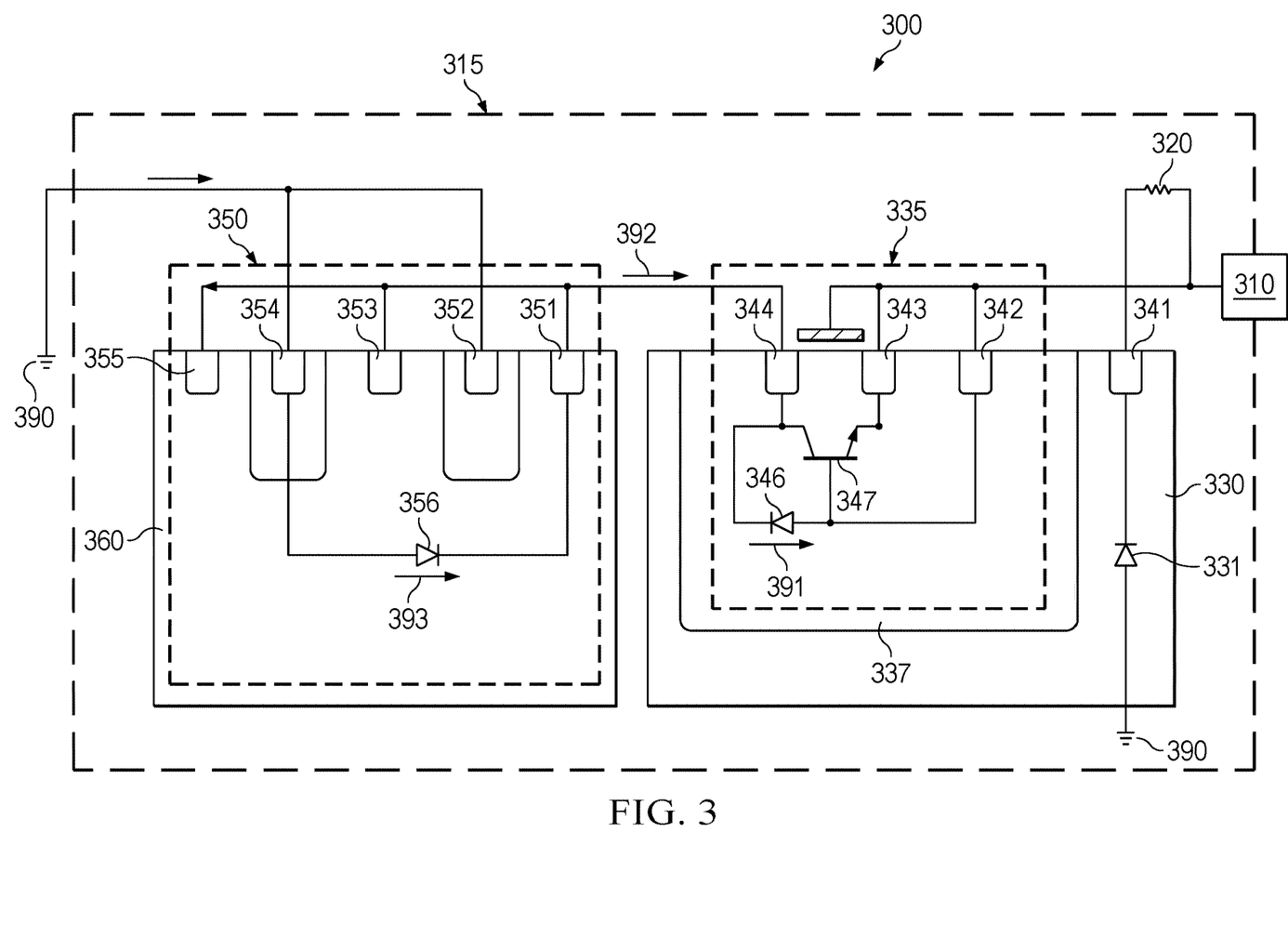
FIG. 3 illustrates one of various examples of a cross-section of an ESD protection circuit during a negative ESD event.

FIG. 3 illustrates one of various examples of a cross-section of an ESD protection circuit 300 during a negative ESD event. Elements of FIG. 2 and FIG. 3 labelled with the same lower 2 digits may represent the same structures.

Pad 310 may be a pad on semiconductor device 315. Semiconductor device 315 may be fabricated on a p-type substrate (not shown). Pad 310 may be coupled to a first node of current limiting resistor 320. A second node of current limiting resistor 320 may be coupled to isolation n-well 330 at well tie 341. Isolation n-well 330 may be an n-type doped semiconductor material. Well tie 341 may be an n-type doped semiconductor material. Well tie 341 may provide an Ohmic contact between current limiting resistor 320 and isolation n-well 330. Diode 331 may be a diode between isolation n-well 330 and the p-type substrate of semiconductor device 315, the p-type substrate coupled to ground 390.

In operation, current limiting resistor 320 may limit the current flowing to pad 310 during negative ESD events, when diode 331 is forward biased.

Pad 310 may be coupled to source node 343 of protection transistor 335. Source node 343 may be an n-type doped semiconductor material. Pad 310 may be coupled to bulk node 342 of protection transistor 335. Bulk node 342 may be a p-type doped semiconductor material. Bulk node 342 may provide an Ohmic contact between pad 310 and p-well 337. P-well 337 is formed within isolation n-well 330.

Diode 346 may be formed between the p-type doped semiconductor material of bulk node 342 and the n-type doped semiconductor material of drain node 344.

Parasitic bipolar device 347 may be formed by drain node 344, bulk node 342, and source node 343. Parasitic bipolar device 347 may enter a snapback mode when sufficient current flows from drain node 344 to bulk node 342. Snapback mode may provide an additional discharge path and may limit the voltage on pad 310.

Protection transistor 335 may be one of various examples of protection transistor 135, as described and illustrated in reference to FIG. 1. Pad 310 may be coupled to gate node 345 of protection transistor 335. Protection transistor 335 is formed within p-well 337.

Drain node 344 of protection transistor 335 may be coupled to protection clamp 350. Protection clamp 350 is illustrated as a diode-connected PNP transistor, but this is not intended to be limiting. Protection clamp 350 may be another clamp or diode structure not illustrated in FIG. 3.

First base node 351 may be an n-type doped semiconductor material. First base node 351 may provide an Ohmic contact between the drain node 344 of protection transistor 335 and n-well 360. Second base node 355 may be an n-type doped semiconductor material. Second base node 355 may provide an Ohmic contact between the drain node 344 of protection transistor 335 and n-well 360.

The example of FIG. 3 is illustrated with two base nodes, first base node 351 and second base node 355, but this is not intended to be limiting. Protection clamp 350 may include a single base node connection or may include more than two base node connections.

Drain node 344 of protection transistor 335 may be coupled to emitter node 353 of protection clamp 350. Emitter node 353 may be a p-type doped semiconductor material. Emitter node 353 and n-well 360 may form a PN junction.

First collector node 352 of protection clamp 350 may be coupled to ground 390. Second collector node 354 of protection clamp 350 may be coupled to ground 390. First collector node 352 may be a p-type doped semiconductor material. First collector node 352 and n-well 360 may form a PN junction. Second collector node 354 may be a p-type doped semiconductor material. Second collector node 354 and n-well 360 may form a PN junction diode 356.

Other parasitic junctions and transistors may exist in ESD protection circuit 300, but these are not illustrated to improve the readability of the figure. This is not intended to be limiting.

In operation, during a negative ESD event, the voltage on pad 310 may decrease to a voltage below ground 390. The voltage may drop on bulk node 342, and diode 346 may reverse bias. As the voltage on bulk node 342 continues to drop, diode 346 may reach a breakdown voltage, and current may flow through diode 346 as illustrated by arrow 391. The current flow from the base connection of parasitic bipolar device 347 to bulk node 342 may result in a voltage difference between the base connection of parasitic bipolar device 347 and bulk node 342 due to the resistance of p-well 337. The voltage at the base connection of parasitic bipolar device 347 may rise above the voltage at bulk node 342, and the base-emitter junction may forward bias and parasitic bipolar device 347 may enter a snapback mode, and may conduct current from drain node 344 to source node 343.

The current flow along path 391 may produce a voltage difference between the base of parasitic bipolar device 347, connected to bulk node 342, and the emitter of parasitic bipolar device 347, connected to source node 343. The voltage difference may forward bias the base-emitter junction in parasitic bipolar device 347, and parasitic bipolar device 347 may enter a snapback mode and conduct current. Current may flow from drain node 344 to source node 343, through parasitic bipolar device 347.

Current may flow from protection clamp 350 to protection transistor 335, as indicated by arrow 392. The voltage at first base node 351 may decrease, and PN junction diode 356 may forward bias, and current may flow as illustrated by arrow 393. In this manner, current may flow from the ground 390, through PN junction diode 356, through parasitic bipolar device 347, and to pad 310. The voltage on pad 310 may be limited by the reverse breakdown voltage of diode 346 plus the forward bias voltage of PN junction diode 356.

Figure 4:
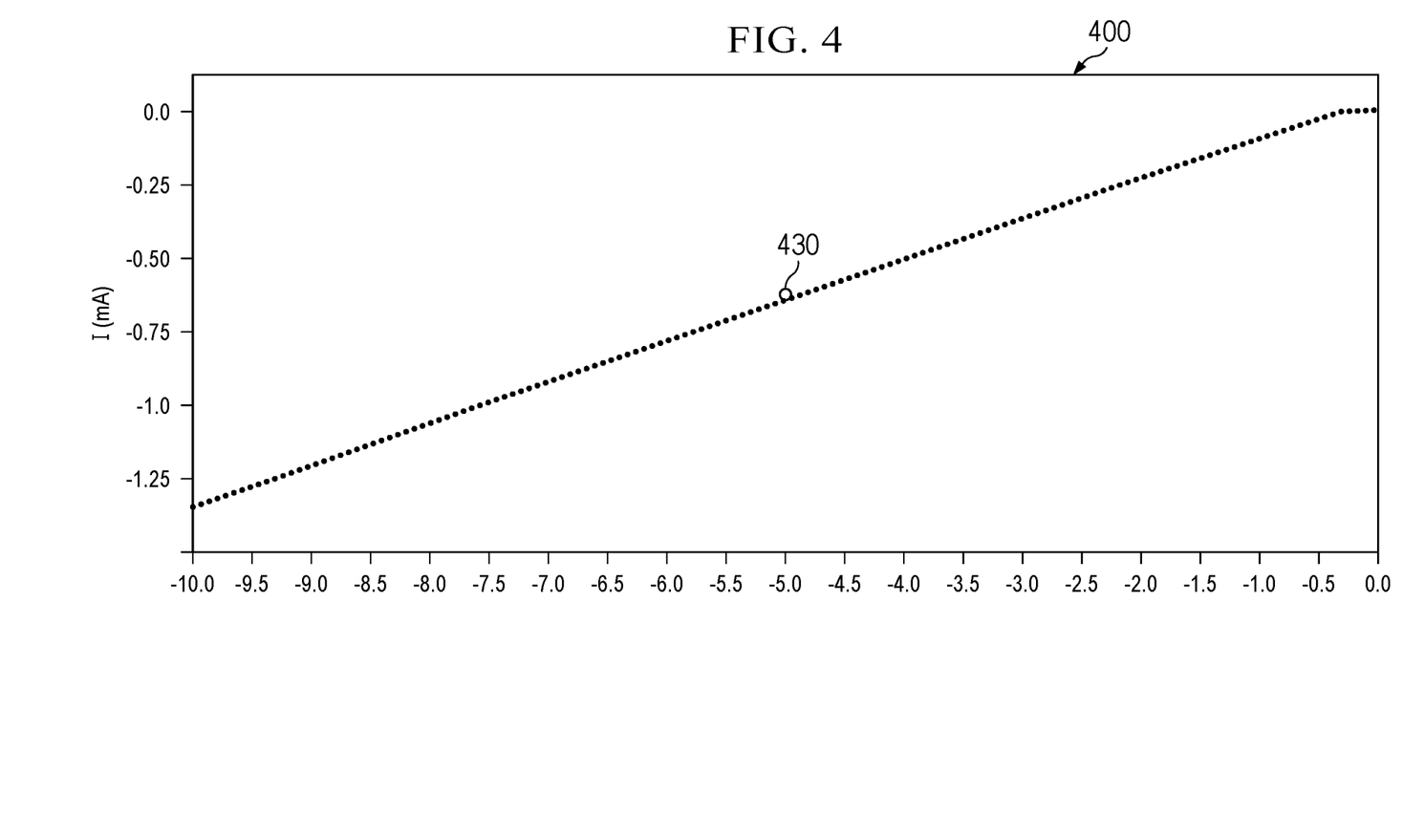
FIG. 4 illustrates one of various examples of input leakage current in an ESD protection circuit.

FIG. 4 illustrates one of various examples of input leakage current in an ESD protection circuit. Plot 400 illustrates input current during a negative biasing voltage on pad 180 in one of various examples of an ESD protection circuit 100 as described in reference to FIG. 1.

The example of FIG. 4 illustrates input current versus negative biasing voltage sweep on pad 180 as described in reference to FIG. 1. The x-axis plot 400 illustrates pad voltages from 0V to −10V. The y-axis of plot 400 illustrates input current in an ESD protection circuit 100 as described and illustrated in FIG. 1.

As illustrated by trace 430 in FIG. 4, as the voltage at the pad increases in negative potential moving from right to left on plot 400, the absolute value of the current flow increases along the y-axis. At a pad voltage of −10V, the current flow in this example does not exceed −1.5 mA.

Figure 5:
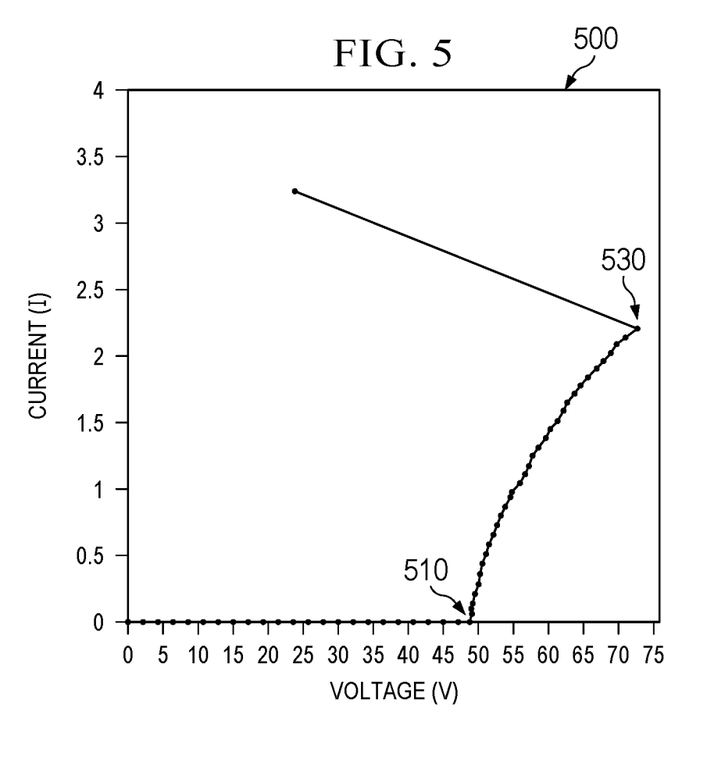
FIG. 5 illustrates one of various examples of current-to-voltage performance of an ESD protection circuit during a positive ESD event.

FIG. 5 illustrates one of various examples of a plot 500 of current-to-voltage performance of an ESD protection circuit during a positive ESD event. Plot 500 illustrates the current-to-voltage performance of one of various examples of an ESD protection circuit 100 as described in reference to FIG. 1.

Voltage at the pad is illustrated on the x-axis, and current through the pad is illustrated on the y-axis. As illustrated in FIG. 5, at location 510, a diode conduction path may begin to conduct current. In reference to the example illustrated and described in FIG. 2, the diode conduction path may be from pad 210, through diode 246 and diode 256 and to ground 290. As illustrated in FIG. 5, at location 530, the ESD protection circuit may enter a snapback mode to limit the voltage to prevent damage.

The specific voltages illustrated in FIG. 5 are not intended to be limiting. In other examples, diodes may conduct current at a voltage different from the voltage illustrated in FIG. 5. Other examples may enter snapback mode at a voltage different from the voltage illustrated in FIG. 5.

Figure 6:
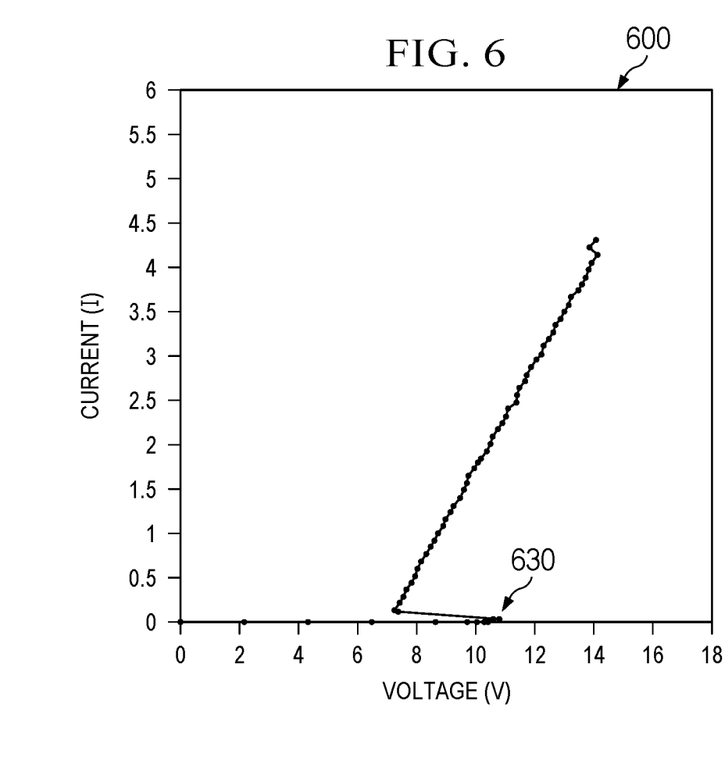
FIG. 6 illustrates one of various examples of current-to-voltage performance of an ESD protection circuit during a negative ESD event.

FIG. 6 illustrates one of various examples of a plot 600 of current-to-voltage performance of an ESD protection circuit during a negative ESD event. Plot 600 illustrates the current-to-voltage performance of one of various examples of ESD protection circuit 100 as described in reference to FIG. 1.

Voltage at the pad is illustrated on the x-axis, and current through the pad is illustrated on the y-axis. As illustrated in FIG. 6, at location 630, the ESD protection circuit may enter a snapback mode to limit the voltage to prevent damage.

The specific voltages illustrated in FIG. 6 are not intended to be limiting. In other examples, diodes may conductor current at a voltage different from the voltage illustrated in FIG. 6. Other examples may enter snapback mode at a voltage different from the voltage illustrated in FIG. 6.

Figure 7:
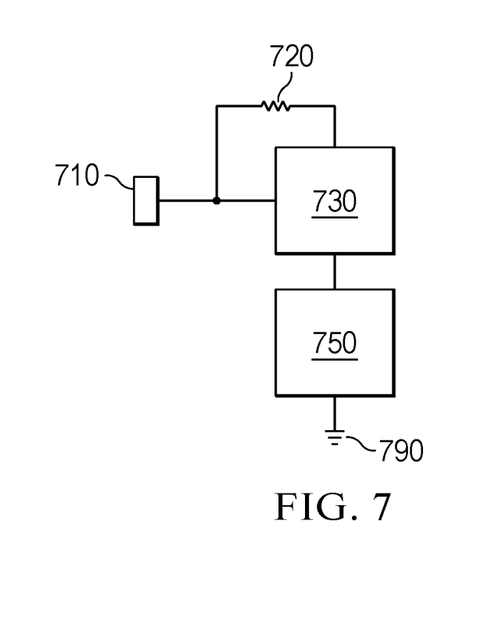
FIG. 7 illustrates one of various examples of an ESD protection circuit.

FIG. 7 illustrates one of various examples of an ESD protection circuit.

FIG. 7 illustrates a pad 710, a current limiting circuit 720, a negative protection circuit 730 and a positive protection circuit 750. Current limiting circuit 720 is illustrated as a resistor, but this is not intended to be limiting. Current limiting circuit 720 may be another circuit capable to limit current.

Pad 710 may be coupled to current limiting circuit 720 and to negative protection circuit 730. Negative protection circuit 730 may be coupled to pad 710, to current limiting circuit 720 and to positive protection circuit 750. Positive protection circuit 750 may be coupled to negative protection circuit 730 and to ground node 790.

Positive protection circuit 750 may be a diode, a bipolar transistor, a metal-oxide semiconductor field effect transistor, or may be another type of protection circuit. Negative protection circuit 730 may be a diode, a bipolar transistor, a metal-oxide semiconductor field effect transistor, or may be another type of protection circuit.

In operation, for positive voltages at pad 710 above a predetermined threshold, current may flow from pad 710, through negative protection circuit 730, through the positive protection circuit 750 and to ground node 790.

In operation, for negative voltages at pad 710 below a predetermined threshold, current may flow from ground node 790, through positive protection circuit 750, through negative protection circuit 730 and to pad 710, the current limited by current limiting circuit 720.

The invention claimed is:

1. A device for ESD protection comprising:
   a current limiting resistor with a first node coupled to a pad and a second node coupled to an isolation n-well;
   a protection transistor located in a p-well inside the isolation n-well, the protection transistor including:
   a source node coupled to the pad;
   a gate node coupled to the pad, and
   a bulk node coupled to the pad;
   a protection clamp located outside the isolation n-well, the protection clamp having a cathode coupled to a drain node of the protection transistor and an anode coupled to ground.

2. The device as claimed in claim 1, wherein the protection clamp comprises a diode-connected PNP transistor.

3. The device as claimed in claim 1, wherein the protection clamp comprises a diode-connected NPN transistor.

4. The device as claimed in claim 1, wherein the protection clamp, for positive voltages at the pad exceeding a predetermined threshold, to pass current from the input pad, through the protection transistor, through the protection clamp, and to the ground.

5. The device as claimed in claim 1, wherein the protection clamp, for negative voltages at the pad below a predetermined threshold, to pass current from the ground return, through the protection clamp, through the protection transistor, and to the pad.

6. A system comprising:
   a pad;
   a current limiting resistor with a first node coupled to the pad and a second node coupled to an isolation n-well;
   a protection transistor formed in a p-well, the p-well located inside the isolation n-well, the protection transistor including:
   a source node coupled to the pad;
   a gate node coupled to the pad, and
   a bulk node coupled to the pad;
   a protection clamp located outside the isolation n-well, the protection clamp having a cathode coupled to a drain node of the protection transistor and an anode coupled to a fixed voltage, the protection transistor located within the isolation n-well and with a source node coupled to the pad, a gate node coupled to the pad, and a bulk node coupled to the pad, and
   one or more circuits coupled to the pad.

7. The system as claimed in claim 6, wherein the protection clamp comprises a diode-connected PNP transistor.

8. The system as claimed in claim 6, wherein the protection clamp comprises a diode-connected NPN transistor.

9. The system as claimed in claim 6, wherein the fixed voltage comprises a ground.

10. The system as claimed in claim 6, wherein the protection clamp, for positive voltages at the pad exceeding a predetermined threshold, to pass current from the input pad, through the protection transistor, through the protection clamp, and to the ground return.

11. The system as claimed in claim 6, wherein the protection clamp, for negative voltages at the pad below a predetermined threshold, to pass current from the ground return, through the protection clamp, through the protection transistor, and to the pad.

12. The system as claimed in claim 6, the protection clamp, protection diode and current limiting resistor to limit the voltage at the one or more circuits.

13. A device comprising:
   a pad;
   a negative protection circuit;
   a positive protection circuit;
   a current limiting circuit;
   wherein:

the negative protection circuit comprises a first node connected to the pad, a second node connected to the positive protection circuit and a third node connected to the current limiting circuit;

the positive protection circuit comprises a first node connected to the negative protection circuit and a second node connected to ground;

the current limiting circuit comprises a first node connected to the negative protection circuit and a second node connected to the pad;

for positive voltages at the pad above a predetermined threshold, current to flow from the pad, through the negative protection circuit, through the positive protection circuit to ground, and for negative voltages at the pad below a predetermined threshold, current to flow from ground, through the positive protection circuit, through the negative protection circuit and to the pad, the current limited by the current limiting circuit.

14. The device as claimed in claim 13, wherein the negative protection circuit comprises a metal-oxide semiconductor field-effect transistor (MOSFET).

15. The device as claimed in claim 13, wherein the positive protection circuit comprises a diode.

* * * * *